United States Patent

Wu

(10) Patent No.: US 6,506,688 B2
(45) Date of Patent: Jan. 14, 2003

(54) METHOD FOR REMOVING PHOTORESIST LAYER ON WAFER EDGE

(75) Inventor: I-Pien Wu, Hsin-Chu (TW)

(73) Assignee: Macronix International Co., Inc. (TW)

(*) Notice: Subject to any disclaimer, the term of this patent is extended or adjusted under 35 U.S.C. 154(b) by 60 days.

(21) Appl. No.: 09/768,058

(22) Filed: Jan. 24, 2001

(65) Prior Publication Data

US 2002/0098709 A1 Jul. 25, 2002

(51) Int. Cl.⁷ .............................................. G03B 27/42
(52) U.S. Cl. ....................................................... 438/759
(58) Field of Search ................................ 438/759, 906, 438/978, 707, 708, 913, 725, 928

(56) References Cited

U.S. PATENT DOCUMENTS 4,899,195 A * 2/1990 Gotoh ............................. 355/1
4,910,549 A * 3/1990 Sugita .......................... 355/53
5,361,121 A * 11/1994 Hattori et al. ................ 355/50
5,811,211 A * 9/1998 Tanaka et al. .............. 382/145

FOREIGN PATENT DOCUMENTS

EP          325 930 A1 *  8/1989    ............ G03F/7/20

* cited by examiner

Primary Examiner—Richard Elms
Assistant Examiner—Beth E. Owens

(57) ABSTRACT

A method for removing a photoresist layer on wafer edge is disclosed. The invention uses a light source located under a spin on coated wafer mounted on a supporting mean of a rotatable chuck to expose the photoresist material on the wafer edge. First of all, the spin on coated wafer is mounted on the supporting mean of the rotatable chuck. Then the rotatable chuck is rotated and the wafer is exposed to the light source. Finally, the wafer is developed.

5 Claims, 3 Drawing Sheets

US 6,506,688 B2

METHOD FOR REMOVING PHOTORESIST LAYER ON WAFER EDGE

BACKGROUND OF THE INVENTION

1. Field of the Invention

The present invention relates to a method for removing the photoresist layer on wafer edge, and more particularly to a method for removing the photoresist layer on wafer edge and leaving the edge of the remained photoresist layer a bevel profile.

2. Description of the Related Art

It is well known that photoresist layers are widely used in modern integrated circuit processing. The photoresist layers are repeatedly applied to a semiconductor wafer by flowing a coating liquid onto the wafer while spinning the wafer, which is the spin coating or spin on process. After the spin on process, usually excess spun on photoresist material covers not only the wafer edge, but also the backside of the wafer. As shown in FIG. 1A, a spin on coated photoresist layer 12 covers the edge and backside of a wafer 10. In the following developing process, the photoresist material on the wafer edge and the backside of the wafer are very likely remained, and with the residual photoresist material are the potential contamination sources leading to various troublesome processing problems.

Conventionally, a wafer edge exposure (WEE) method and a edge bead rinse (EBR) method are used to solve the problems mentioned above. Unfortunately, the WEE method and the EBR method have some native problems individually. The WEE method utilizes additional exposing and developing processes to remove the photoresist material on the wafer edge. As shown in FIG. 1B, the photoresist material on the edge of wafer 10 is removed, and a perpendicular profile of both the edges of the photoresist layer 12 and the film covered by the photoresist layer 12 are formed. The perpendicular profile may cause peeling or breaking problems of the sequentially deposited metal or polysilicon layers. Furthermore, in the following etching process, a rough surface 14 of the wafer edge is very likely formed, and pits of the rough surface may adsorb or retain residual photoresist material. The residual photoresist material may contaminate the following processing and induce peeling or adhesion problems of the sequentially deposited films.

The EBR method uses a stream of solvent directed at the wafer edge to remove the photoresist material on the wafer edge. Because the nature of the stream of solvent, the EBR method also causes some processing problems. As shown in FIG. 1C, a residual photoresist material 16 remains after performing the EBR method. The residual photoresist material 16 may cause following deposited film adhesion and contamination problems. FIG. 1D, which is a top view of the wafer 10 having the photoresist layer 12 thereon, shows another problem of the EBR method, which is an asymmetric profile.

According to the problems of the conventional methods set forth, it is very necessary to provide a total solution. It is towards those goals that the present invention is specifically directed.

SUMMARY OF THE INVENTION

It is therefore an object of the invention to provide a method for removing the photoresist layer on the wafer edge and leaving the edge of the photoresist layer with a bevel profile, meanwhile, protecting the wafer edge from being etched.

It is another object of this invention to provide a method for removing the photoresist layer on the wafer edge without the residual and contamination problems of the photoresist material.

It is a further object of this invention to prevent the peeling and adhesion problems of following deposited films resulting from the residual and contamination problems of the photoresist material induced in the photolithography process.

To achieve these objects, and in accordance with the purpose of the invention, the invention uses a light source located under a spin on coated wafer mounted on a supporting mean of a rotatable chuck to expose the photoresist material on the wafer edge. First of all, the spin on coated wafer is mounted on the supporting mean of the rotatable chuck. Then the rotatable chuck is exposed to the light source and the wafer is rotated. Finally, the wafer is developed.

It is to be understood that both the foregoing general description and the following detailed description are exemplary and explanatory only and are not restrictive of the invention, as claimed.

BRIEF DESCRIPTION OF THE DRAWINGS

The objects, features and advantages of the method for the present invention will be apparent from the following description in which.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention. Moreover, applications of the present invention should not be limited to integrated circuit fabrication techniques applied in silicon wafers, but will include those applied in other semiconductor wafers, such as gallium arsenide wafers.

The present invention will be described in detail with reference to the accompanying drawings. It should be noted that the drawings are in greatly simplified form and they are not drawn to scale. Dimensions have been exaggerated in order to provide a clear illustration and understanding of the present invention.

The invention uses a light source located under a spin on coated wafer mounted on a supporting mean of a rotatable chuck to expose the photoresist material on the wafer edge.

First of all, the spin on coated wafer is mounted on the supporting mean of the rotatable chuck. Then the rotatable chuck is exposed to the light source and the wafer is rotated. Finally, the wafer is developed.

Figure 1A:
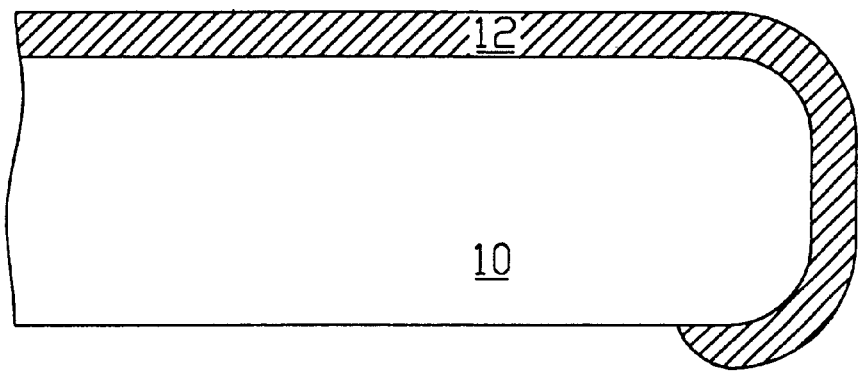
FIG. 1A is a schematic cross-sectional diagram that illustrates a wafer coated by a photoresist layer.
Figure 1B:
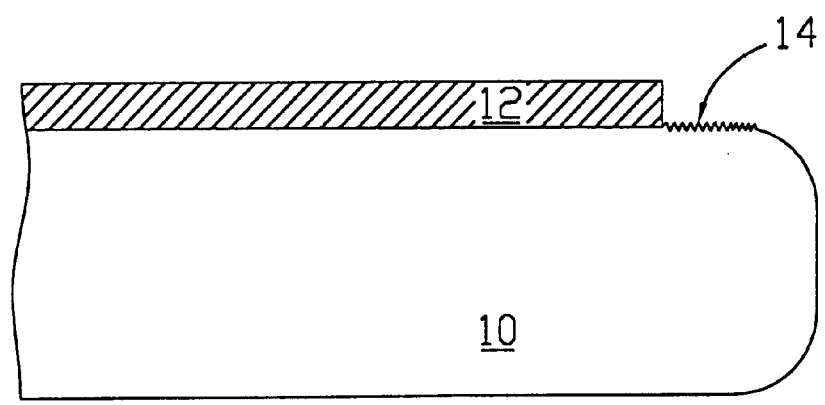
FIG. 1B shows a result of using a WEE method and etching the wafer shown in FIG. 1A.
Figure 1C:
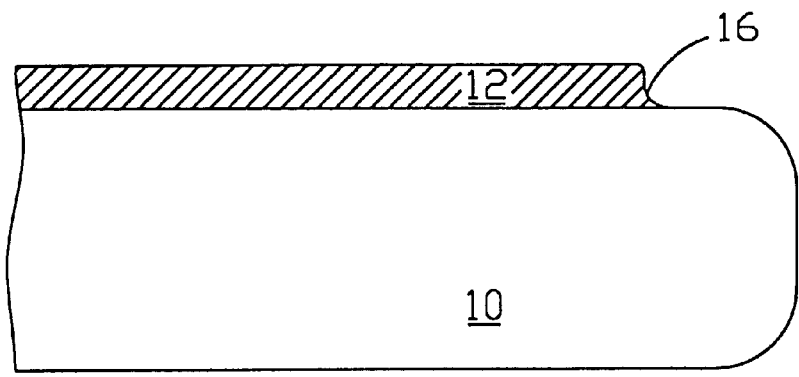
FIG. 1C shows a result of using an EBR method on the wafer shown in FIG. 1A.
Figure 1D:
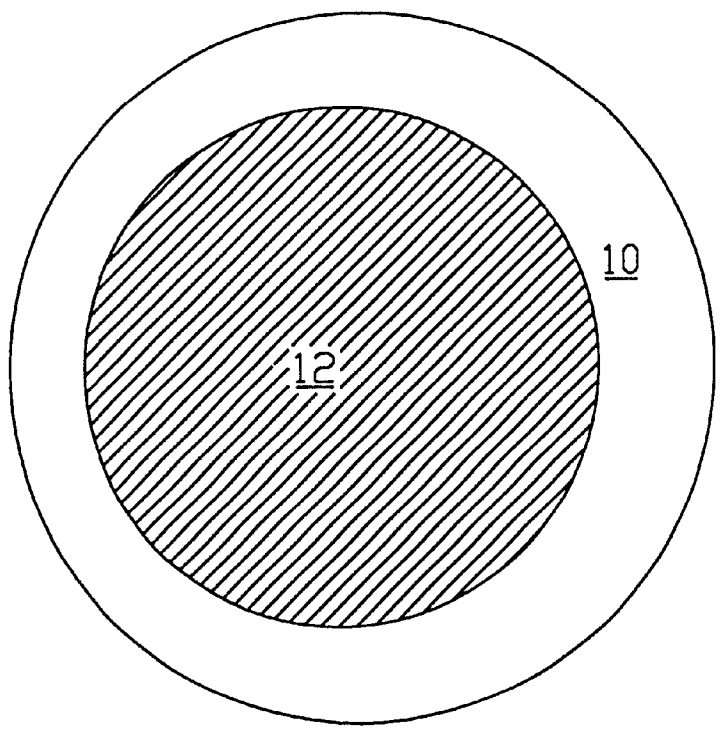
FIG. 1D is a top view diagram of the wafer shown in FIG. 1C.
Figure 2A:
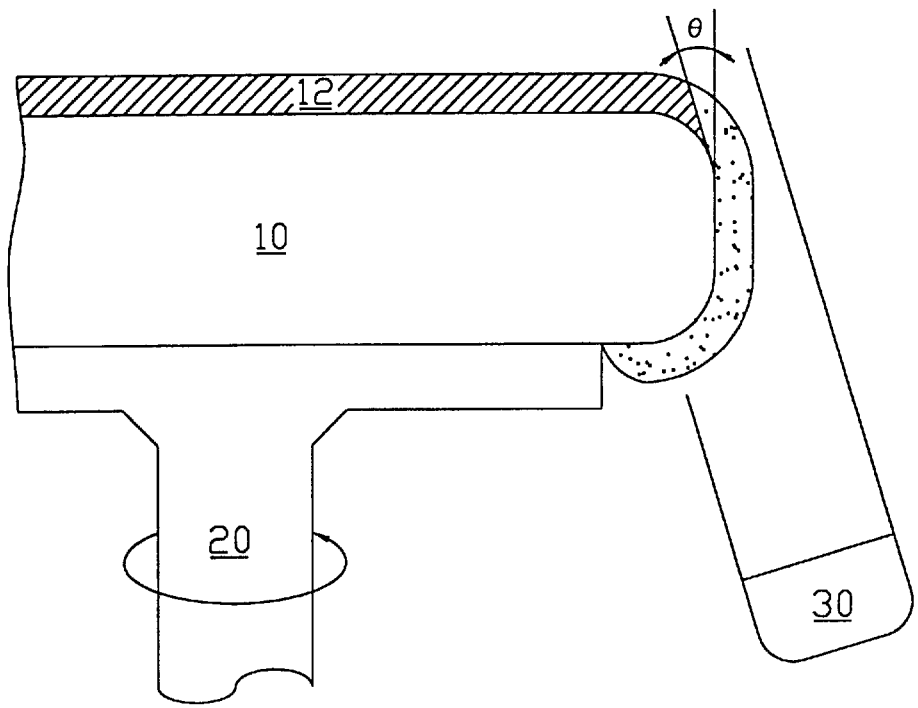
FIG. 2A shows the method and the apparatus of the invention to remove the photoresist material on the wafer edge.

Referring to FIG. 2A, the wafer 10 having the photoresist layer 12 thereon shown in FIG. 1A is mounted on a supporting mean of a rotatable chuck 20, and a light source 30 is located at a position under the supporting mean. The wafer 10 can be a conventional semiconductor wafer, for example, a silicon wafer or a gallium arsenide wafer, and it is preferably a silicon wafer with a <100> crystal orientation. It is noted that the wafer 10 is not necessary a blank wafer. Instead, it can be a wafer under processing with devices and integrated circuits in and on it. The photoresist layer 12 can be photoactive materials, for example, a positive photoresist layer. The positive photoresist layer is preferably spin on coated on the wafer 10 with a thickness of about 0.5 to about 1 $\mu$m. After the wafer 10 is placed and mounted on the supporting mean of the rotatable chuck 20, it is rotated as the rotatable chuck 20 spins at a predetermined speed. Then the light source 30 is adjusted to a desired angle, which is formed by intersecting the direction of the light and the normal direction of the wafer 10, and emits the light to render the photoresist material on the edge of the wafer 10 exposed. The angle can be in a range of 0 degrees to 90 degrees, and is preferably 60 degrees. The light source can be a conventional one used in the art, for example, a mercury lamp that emits a spectrum of ultraviolet light with a wavelength from about 350 nm to about 450 nm or a He—Xe lamp. An i-line source with a wavelength of 365 nm or a a g-line source with a wavelength of 436 nm are commonly used. Other light sources, such as deep-ultraviolet with a wavelength of 240 nm, e-beam and X-ray can also be utilized.

To increase the throughput, the wafer 10 can also be spin on coated and the photoresist material on the wafer edge can be exposed to the light source 30 sequentially, while the rotatable chuck 20 continues rotating. In the following developing process, the exposed photoresist material on the wafer edge can be removed together with the photoresist layer used to define the integrated circuit fabricated in and on the wafer 10.

Figure 2B:
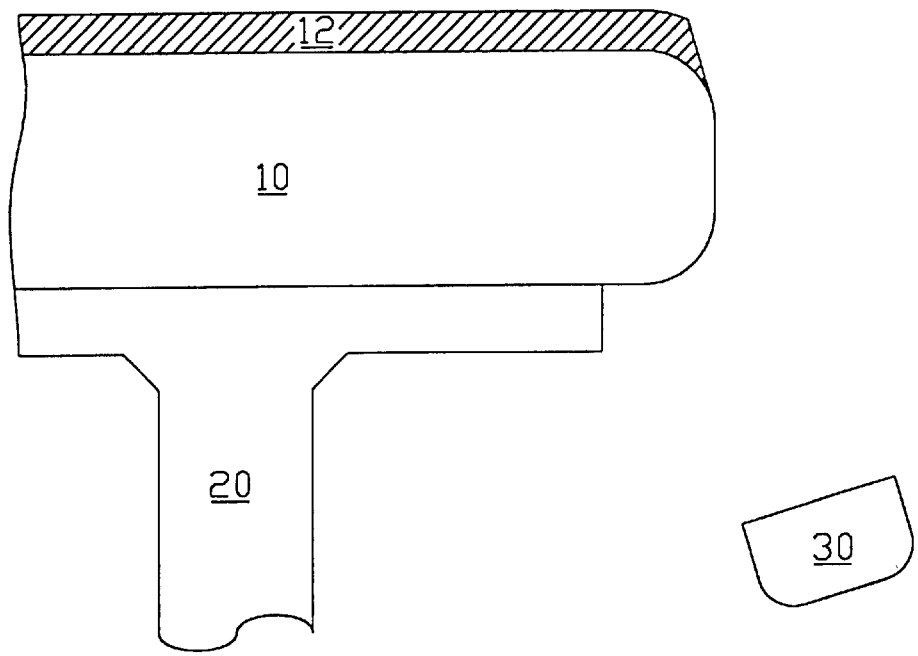
FIG. 2B shows a result of removing the photoresist layer on the wafer edge shown in FIG. 2A.

Referring to FIG. 2B, the photoresist material on the wafer edge is removed. A bevel profile of the edge of the photoresist layer 12 is formed. The edge of the photoresist layer 12 with the bevel profile can protect the edge of the wafer 10 from being etched during the integrated circuit processing, thereby prevent the troubling peeling and adhesion problems of the following deposited films resulting from the residual and the contamination problems of the photoresist material from being formed. By utilizing the method of this present invention, the micro-electronic industry can upgrade the yield ratio of production more efficiently.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for removing a photoresist layer on wafer edge, said method comprising:

providing a wafer;

mounting said wafer on a supporting mean of a rotatable chuck;

rotating said rotatable chuck;

forming a photoresist layer over said wafer;

exposing said wafer to a light source, wherein said light source is located at a position under said wafer; and developing said photoresist layer.

2. The method according to claim 1, wherein said light source is an ultraviolet light with a wavelength from about 350 nm to about 450 nm.

3. The method according to claim 1, wherein said light source is a deep UV light source with a wavelength of about 240 nm.

4. The method according to claim 1, wherein said light source is an e-beam light source.

5. The method according to claim 1, wherein said light source is an X-ray light source.

* * * * *